United States Patent
Bahns et al.

(10) Patent No.: US 6,472,889 B1
(45) Date of Patent: Oct. 29, 2002

(54) APPARATUS AND METHOD FOR PRODUCING AN ION CHANNEL MICROPROBE

(75) Inventors: John T. Bahns, Storrs; William C. Stwalley, Mansfield Center, both of CT (US)

(73) Assignee: University of Connecticut, Farmington, CT (US)

( * ) Notice: Subject to any disclaimer, the term of this patent is extended or adjusted under 35 U.S.C. 154(b) by 139 days.

(21) Appl. No.: 09/595,253

(22) Filed: Jun. 15, 2000

(51) Int. Cl.$^7$ .............................................. G01R 31/305
(52) U.S. Cl. ...................................... 324/751; 324/752
(58) Field of Search ................................ 324/459, 500, 324/501, 514, 537, 750, 751, 752, 754; 250/309, 307

(56) References Cited

U.S. PATENT DOCUMENTS

| | | | |
|---|---|---|---|
| 4,644,264 A | | 2/1987 | Beha et al. |
| 4,706,018 A | | 11/1987 | Beha et al. |
| 4,970,461 A | * | 11/1990 | LePage ........................ 324/514 |
| 5,030,909 A | | 7/1991 | Blancha et al. |
| 5,179,279 A | * | 1/1993 | Millard et al. .............. 250/307 |
| 5,335,238 A | | 8/1994 | Bahns |
| 5,345,465 A | | 9/1994 | Bahns |
| 5,680,056 A | * | 10/1997 | Ito et al. ...................... 324/501 |
| 5,818,239 A | * | 10/1998 | Scaman ....................... 324/501 |

FOREIGN PATENT DOCUMENTS

EP   0 409 398 A2   6/1990

OTHER PUBLICATIONS

H. Tamura, et al., Laser Initiation of an Electrical Discharge Channel in Cesium Contained Gas, *J. Appl. Physics*, vol. 59, No. 11, Jun. 1, 1986, pp. 3722–3727.

Bahns, J. T., Koch, M., and Stwalley, W. C., Laser–Induced Plasmas in Metal Vapors, Laser and Particle Beams 7, 545–550 (1989).

Bahns, J. T., Tsai, C. C., Ji, B., Kim, J. T., Zhao, G, Stwalley, W. C., Bloch, J. C. and Field, R. W., Laser Frequency–Modulated Spectroscopy of a Laser–Guided Plasma in Sodium Vapor: Line Positions for NaH. Na (9–13 d and 11–14 s), and Ar (5p–45), J. Mol. Spectrosc. 186, 222–229 (1997).

Bettis, J. R., Correlation Among the Laser–Induced Breakdown Thresholds in Solids, Liquids, and Gases, Appl. Opt. 31, 3448–3452 (1992).

Coles, G. V., Making the Sensitivity Selective: A Review of Semiconductor Gas Sensor Technology, Electronic and Optoelectronic Materials for the 21st Century, ed. by Marshall, J. M., Kirov, N., and Vavrek, A. (World Scientific Singapore, 1992), pp. 162–168 no month available.

(List continued on next page.)

*Primary Examiner*—Michael Sherry
*Assistant Examiner*—Minh N. Tang
(74) *Attorney, Agent, or Firm*—Cummings & Lockwood

(57) ABSTRACT

A noncontact method and apparatus for testing electrical circuitry which provides large improvements in both resolution and speed. The attributes of noncontact, high resolution, and speed are satisfied by using inexpensive low intensity resonant laser beams in a shroud gas preferably comprising rubidium atoms in argon gas to create an electrically conductive ion channel microprobe. The conductive ion channel microprobe can be used to create an electrically conductive path between a circuit's test pad or point and signal generation and detection apparatus. If the circuit's test pad or point is functioning properly, then the ion channel microprobe will complete the electrically conductive path, the signal generation device will produce a signal over the conductive path and the signal detection device will detect or measure the signal. If the circuit's test pad or point is malfunctioning, the conductive path will remain open and the signal detection device will not detect a signal.

44 Claims, 14 Drawing Sheets

OTHER PUBLICATIONS

Lam, L. K., and Schearer, L. D., Laser Initiated Afterglow in a High Pressure K–Kr Mixture, Chemical Physics Letters, 60, 130–34 (1978).

Minowa, T., Kawata, T., Katsuragawa, H., and Uematsu, H. K., Initial Phase of Laser–Induced Air Optical Breakdown: A New Picture, Appl. Opt. 37, 1099 (1998).

Rekha, T., and Thareja, R. K. Laser–Induced Breakdown Studies of Laboratory Air at 0.266, 0.355, 0.532 and 1.04 $\mu$m, J. Appl. Phys., 70, 2890–2892 (1991).

Samsonov, G. V., *The Oxide Handbook* (Plenum, New York, 1973) pp. 263–280). no month available.

Stwalley, W. C. and Koch, M. E., Alkali Metal Vapors: Laser Spectroscopy and Applications, Opt. Eng. 19, 71–84 (1980).

Stwalley, W. C. and Bahns, J. T., Atomic, Molecular and Photonic Processes in Laser–Induced Plasmas in Alkali Metal Vapors, Laser and Particle Beams 11, 185–204 (1993). no month available.

Tam, A. C. and Happer, W., Plasma Production in Cs Vapor by a Weak CW Laser Beam at 6010 A, Opt. Commun. 21, 403–407 (1977).

Tsai, C–C., Bahns, J. T and Stwalley, W. C., Shielded Space–Charge–Limited Diode Ionization Detector, Rev. Sci. Instrum. 63, 5576–5581 (1992).

Tsai, C–C., Bahns, J. T and Stwalley, W. C., Observations of $Na_2$ Rydberg States and Autoionization Resonances by High Resolution All–Optical Triple Resonance Spectroscopy, Chem. Phys. Lett. 236, 553 (1995).

Veza, D. and Sansonetti, C. J., Ionization of Lithium Vapor by CW Quasiresonant Laser Light, Z. Phys D: Atoms Molecules and Clusters 22, 463–470 (1992).

* cited by examiner-

APPARATUS AND METHOD FOR PRODUCING AN ION CHANNEL MICROPROBE

FIELD OF THE INVENTION

The present invention relates generally to laser generated ion channels used for testing. More specifically, it relates to a laser generated ion channel that uses at least one laser to create an ion channel in a specially prepared shroud gas for testing electrical circuitry.

BACKGROUND OF THE INVENTION

The printed circuit board (PCB) industry mandates the rapid testing of its electrical circuitry. As the size of electrical circuitry features, such as test pads, have become smaller due to higher circuit densities, traditional testing methods which rely on solid-to-solid contacts have become too slow, too destructive (from physical damage to circuitry features), and too costly (due to increased resolution and speed requirements). Thus, there is great need for developing new methods of "non-contact" testing of PCBs that are faster and less destructive.

Non-contact testing of the prior art typically takes advantage of the photoelectric effect (photoelectric emission of electrons from the surface of a metal) to complete a test circuit. For example, U.S. Pat. Nos. 5,030,909, 4,706,018, and 4,644,264 all disclose the use of the photoelectric effect in conjunction with high intensity pulsed laser beams to facilitate noncontact testing. U.S. Pat. No. 5,030,909, to Blancha et al. discloses a contactless testing method that involves photoelectron emission from solid surfaces in an evacuated chamber using high power pulsed lasers emitting photons of optimum energy. U.S. Pat. No. 4,706,018 to Beha discloses a noncontact dynamic tester for integrated circuits that uses short pulses of high intensity laser light to generate photoelectron emission from solid surfaces in a high vacuum environment having a pressure of about $10^{-5}$ to $10^{-6}$ Torr. U.S. Pat. No. 4,644,264 to Beha et al. discloses photon assisted tunneling testing of passivated integrated circuits, a noncontact technique using high intensity lasers having short pulses of about 5 picoseconds to produce photoelectron emission from solid surfaces, such as test pads.

As each of the three patents described all operate using the scientific principle called the photoelectric effect they inherently suffer from operational defects including, but not limited to, the need for high intensity short pulse lasers, passivation layers, overlayers and/or vacuum systems for successful implementation.

In U.S. Pat. Nos. 5,345,465 and 5,335,238 and in the publication Laser Frequency Modulated Spectroscopy of a Laser-Guided Plasma in Sodium Vapor, J. MOL. SPECTROSC. 186, 222–229 (1997), the present inventors disclose non-contact apparati and methods for guiding an electric discharge which do not take advantage of the photoelectric effect. Such publications disclose, instead, employment of a single quasiresonant laser beam generated by photoexcitation of alkali atoms in the gas phase (so called, "Laser Guided Discharges" or "LGD"). While eliciting several advantages over prior art techniques employing the photoelectric effect, quasiresonant photoexcitation suffers from the disadvantage of requiring an undesirable threshold density.

A need exists, therefore, for a non-contact method of testing PCBs that is faster, less destructive and less expensive than those methods currently available and which does not rely on the use of the photoelectric effect nor employ quasiresonant photoexcitation.

SUMMARY OF THE INVENTION

The present invention provides a noncontact method and apparatus for testing electrical circuitry which provides significant improvements in both resolution and speed over the prior art. The attributes of noncontact, high resolution, and speed may be satisfied by using inexpensive low intensity resonant laser beams in a novel shroud gas to create an electrically conductive ion channel microprobe.

The conductive ion channel microprobe of the present invention may be used to create an electrically conductive path between a circuit's test pad or point and signal generation and detection apparatus. If the circuit's test pad or point is functioning properly, then the ion channel microprobe will complete the electrically conductive path, the signal generation device will produce a signal over the conductive path and the signal detection device will detect or measure the signal. If the circuit's test pad or point is malfunctioning, the conductive path will remain open and the signal detection device will not detect a signal.

The present invention operates using the principle of photoionization of a gas and not the photoelectric effect. Advantageously, the present invention can operate with low intensity continuous wave (CW) lasers without the need for use of passivation layers, overlayers, vacuum systems, or chambers of any kind.

Unlike the prior art, the laser of the present invention uses resonant excitation, which couples the laser field directly to the ground atomic state, as opposed to quasiresonant excitation which does not. By employing resonant excitation, the present system may advantageously operate using inexpensive low intensity resonant laser sources.

The present ion channel microprobe (ICM) invention proffers significant advantages over LGD-based systems, such as: permitting the use of a transparent semiconductor electrode instead of a hollow metal electrode; allowing operation at an unheated temperature of about 300 K (instead of about 800 K typically employed in LGD-based systems) and at about 760 Torr pressure (instead of about 1 Torr typically employed in LGD-based systems); and permitting measurements to be taken in an atmospheric environment not requiring a chamber (instead of requiring a vacuum chamber environment as in LGD-based systems). Also, fundamental differences exist with the laser beam dynamics—the ICM may make. use of a scannable laser having high speed and resolution, while LGD conventionally employs a fixed laser having an unscannable configuration. The ICM may further make use of two or more ion channels for scanning conductivity tests of printed circuit board features. The ICM technique of the present invention differs from LGD in that it operates at typical alkali densities of about $10^{11}$ atoms per $cm^3$, approximately six orders of magnitude below the quasiresonant threshold density of about $10^{17}$ atoms per $cm^3$.

Generally, the system for producing an ion channel of the present invention comprises a first electrically conductive material such as a transparent electrode, a second electrically conductive material such as a test pad, a shroud gas containing a gas of either argon, helium, neon, krypton, xenon or nitrogen, and an alkali metal of either rubidium, resonant laser beam such that the laser beam propagates through the first conductive material, propagates through the shroud gas to produce an ion channel within the shroud gas, contacts the second conductive material, and creates an electrically conductive ion channel between the first electrically conductive material and the second electrically conductive material to define first and second terminals, respectively, of an electrical path.

Because the present invention uses resonant laser beams to produce photoionization, the present method of non-contact testing is less expensive, fast and has greater resolution.

DETAILED DESCRIPTION OF THE INVENTION

Figure 1:
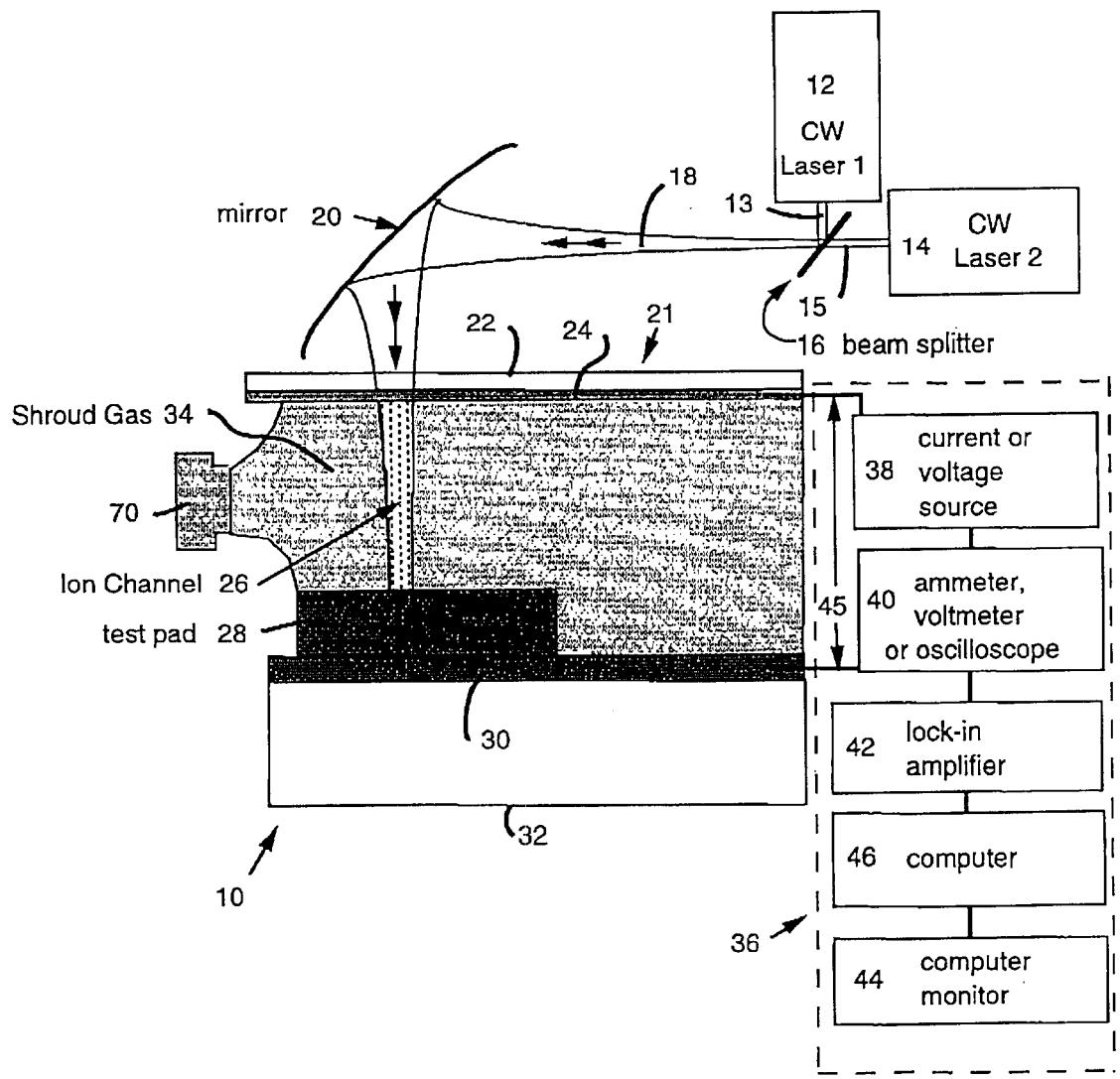
FIG. 1 is a partial cross sectional view of the apparatus for producing an ion channel microprobe of the present invention including a block diagram of a signal generation and detection apparatus.

The present invention uses a laser beam in a shroud gas to produce an ion channel microprobe (ICM), which can be used for the purposes of testing electrical circuitry. The present invention provides what has eluded the art for years—a suitable shroud gas that can be ionized at low laser intensities and that can be used under ambient atmospheric conditions at standard temperature and pressure (STP). A shroud gas of the present invention preferably includes an alkali metal and/or alkaline earth metal in combination with a noble gas which is non-reactive with the, same. For example, it has been found that rubidium in argon forms a shroud gas that permits ICM formation under ambient conditions at STP using inexpensive diode lasers at 780 nm and 776 nm.

Generally, the shroud gas metal of the present invention includes an alkali metal from group 1A (also known as group 1) of the periodic table, such as lithium, sodium, potassium, rubidium, cesium, or francium, or an alkaline earth metal from group 2A (also known as group 2) of the periodic table, such as magnesium, calcium, strontium, barium or radium. While some alkali metal atoms, such as sodium, lithium and most of the remaining elements, may be used, such atoms possess higher ionization potentials and have lower vapor pressures at a given temperature than potassium, rubidium and cesium, mandating undesirably shorter laser wavelengths for ionization and heating the shroud gas to a higher temperature such that an adequate densities for ion channel formation can be achieved. For the present invention, it is preferred to use low alkali metal densities (typically 4 ppb (~$10^{11}$ $cm^{-3}$) in 1 atmosphere argon). At these alkali metal densities, surface contamination and alkali consumption are negligible (e.g. 1 gram of rubidium would last around 5,000 years).

Argon gas was found to be a preferred shroud gas. Other gases, however, can be substituted for argon. These include noble gases from group 8A of the periodic table such as helium, neon, krypton, xenon and radon. Nitrogen gas has also been found to be useful. Preferably, the shroud gas is kept at a temperature of less than about 100° C. and a pressure greater than about 0.5 atm. More preferably, the shroud gas is kept at a temperature between about 20° C. to about 80° C. Even more preferably, the shroud gas is kept a temperature between about 40° C. to about 50° C. and a pressure of between about 0.5 atm to about 1.5 atm.

Efficient ionization of rubidium atoms at low laser power can be achieved through the following two-photon resonant, three-photon ionization scheme:

1. Rb (5s $^2S_{1/2}$)+L1 (780.2406 nm)→Rb* (5p $^2P_{3/2}$);
2. Rb* (5p $^2P_{3/2}$)+L2 (775.9782 nm)→Rb** (5d $^2D_{5/2}$); and
3. Rb** (5d $^2D_{5/2}$)+(L1 or L2)→Rb$^+$+e$^-$+0.6 eV, The first two transitions are resonant and highly saturated (I/I(sat.)~$10^4$) with just 5 mW of laser power. Specifying the length of the ion channel to be one Rayleigh range of the focused laser beams ($Z_0$)=Z=5 mm, a spatial resolution of approximately 86 $\mu$m is readily achieved with standard optics (f=9 cm), which is well within the maximum resolution desired for current non-contact testing of PCBs of approximately 200 $\mu$m (~8 mil=0.008 inches; 1 mil=25.4 $\mu$m). Thus, the ion channel of the present invention is typically capable of resolution in a range of 0.5 mil to 10 mil. Laser intensities in the rubidium ion channel can vary from 43 W/cm$^2$ at the conductive film to 86 W/cm$^2$ at the test pad.

The transitions in steps (1) and (2) above are highly saturatable at low laser intensities (I(sat)~1.4 and 6.3 mW/cm$^2$ at 775.98 and 780.24 run, respectively). For 5 mW lasers, the saturation parameter S (where S=0.5/(1+I(sat)/I)) equals approximately 0.5. For the ionization step (3), the photoionization cross section σ (5d) is approximately 0.8× $10^{-8}$ cm$^2$. Taking the photon flux F to be approximately 3×$10^{20}$ cm$^{-2}$s$^{-1}$, the photoionization rate per Rb atom is RPI=$\sigma_a$(5d)F, which equals approximately 240 s$^{-1}$.

Ionization can be achieved by single photon photoionization when the photon energy exceeds the ionization potential of the ionizable constituent of the shroud gas. Cesium, which has the lowest ionization potential (IP) of all stable elements (IP=31406.71 cm$^{-1}$), requires photons having a wavelength of λ<318.4 nm (rubidium requires that the wavelength be λ<296.8 nm). Inexpensive low power lasers are not yet available at these wavelengths, although frequency doubled (tripled, etc.) sources are presently commercially available for λ<318.4 nm.

Ionization can also be achieved by two-photon resonant, three-photon ionization. This type of ionization is described explicitly in equations 1-3 above and in FIG. 4 for a shroud gas of rubidium atoms in argon.

Ionization can also be achieved by single-photon resonant, two-photon ionization. This type of ionization is illustrated for rubidium atoms in FIG. 5. This type of ionization has just recently become possible with the advent of commercially available blue (GaN) diode lasers (390–420 nm). The advantage of this ionization scheme is that L2 (14) can be "free-running" such that a locking circuit would not be required.

FIG. 1 shows the apparatus 10 for producing an ion channel microprobe (ICM) of the present invention. First 12 and second 14 laser systems produce first 13 and second 15 output optical laser beams, respectively. At least one laser system is necessary for the present invention, but preferably two diode laser systems having different frequencies are used as shown in FIG. 1. If only one laser system is used, preferably, the single laser system produces a laser beam having two combined frequencies. Otherwise, if only a single laser system having a single frequency is used, the ICM will require a laser system having a higher power capability.

Beam combiner 16 is located within the paths of laser beams 13 and 15 and combines them to produce co-propagating laser beams 18. Optical element 20 directs and focuses co-propagating beams 18 through a transparent electrode 21 and shroud gas 34. The co-propogating beam 18 terminates on test pad 28. The transparent electrode preferably comprises of a glass plate 22 undercoated with a semi-transparent electrically conductive film 24, such as semi-transparent metals or semiconductors (or alternatively, metal grids or meshes). Preferably, the transmission of the electrically conductive film 24 is above 70% for a 780 nm wavelength laser.

Co-propogating laser beams 18 ionize rubidium atoms in the shroud gas 34 to produce an ion channel 26 coincident with laser beams. Because the shroud gas 34 is effectively in contact with the electrically conductive film 24 and the test pad 28, the ion channel 26 produces an electrically conductive path between film and the spaced apart test pad. Currently, test pads are manufactured at approximately 200×200 ($\mu$m)$^2$ (~8×8 mil$^2$); hence the ion channel 26 needs to be approximately less than 200 $\mu$m in diameter. The ion channel 26 forms an electrical connection between the conductive film 24 and the test pad 28 and printed circuit 30 of a printed circuit board 32.

A low voltage potential is applied by a voltage or current source 38 between the conductive film 24 and test pad 28 using test leads 45. An ion channel signal detection system 36 detects and preferably measutes current flow through the ion channel. Preferably, an ammeter 40 is used, although a voltage meter or oscilloscope in parallel with a low resistance that is in series with the source 38 could also be used. More preferably, electrical currents due to conduction of the ion channel 26 are detected with an ammeter and lock-in amplifier 42 coupled to the ammeter. A computer 46 is preferably coupled to the lock-in amplifier 42 and to a monitor 44 such that measured signals can stored on the computer and displayed on the monitor.

Figure 2:
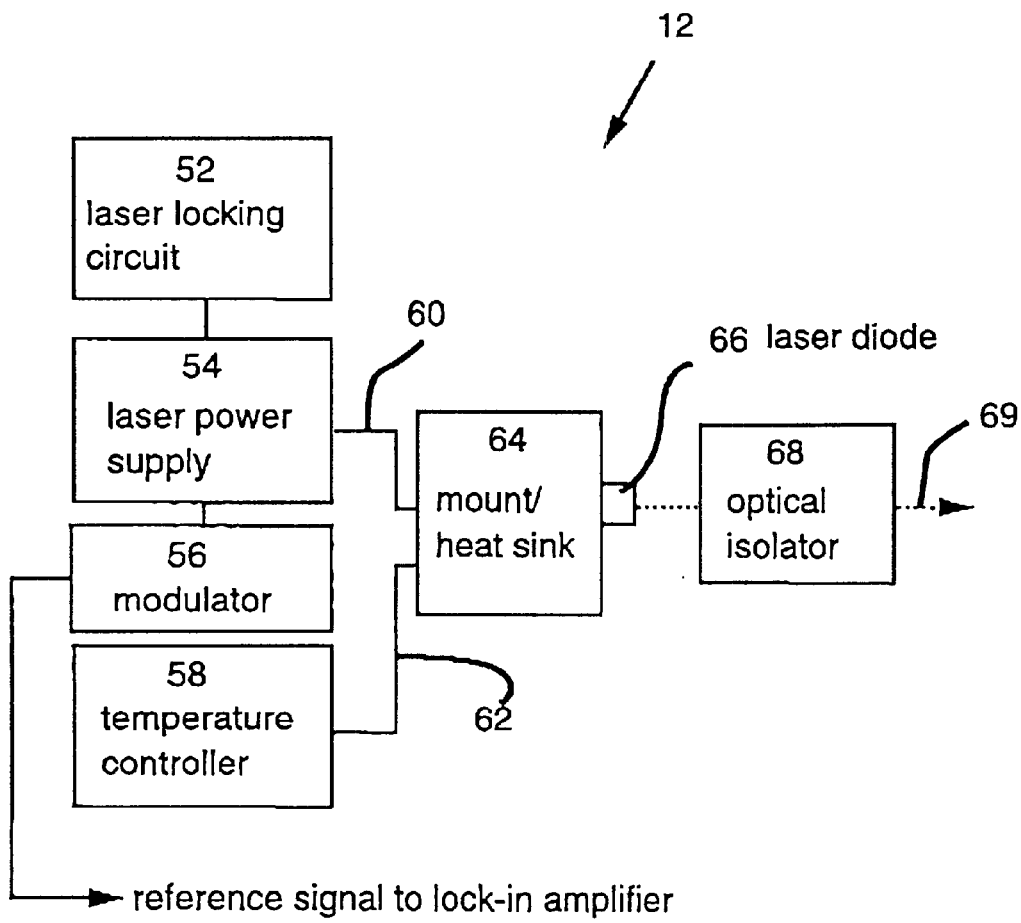
FIG. 2 is a block diagram of a diode laser system for the ion channel microprobe apparatus of FIG. 1.

Referring to FIG. 2, each diode laser system 12, 14 consists of a power supply 54, modulator 56, temperature controller 58, leads for power 60 and temperature control 62, laser diode mount/heat sink 64, and laser diode elements 66.

Locking circuits 52 control the laser frequency by "locking" it to a frequency standard such as etalons or atomic resonances (e.g. Rb 5s-5p and 5p-5d). A diode laser output beam 69 passes through optical isolators 68 to prevent scattered light from returning to laser diode elements.

Figure 3:
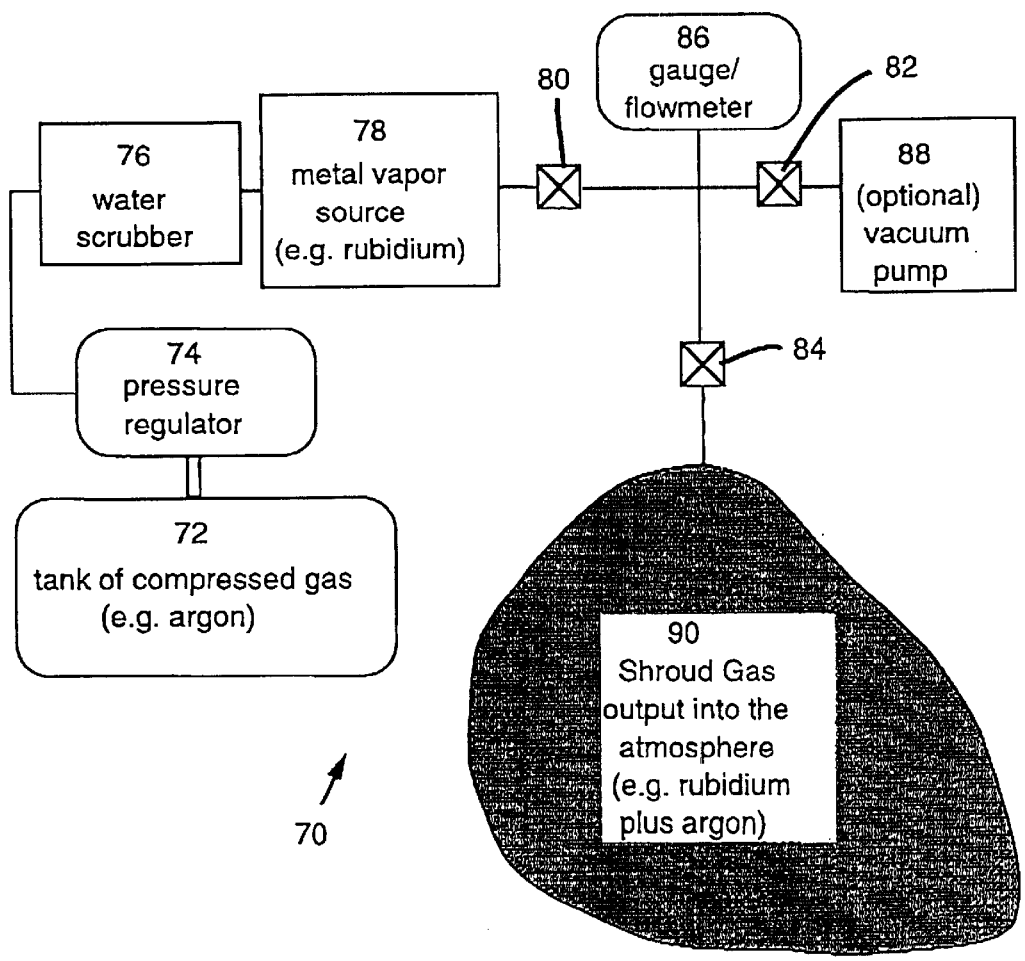
FIG. 3 is block diagram of a shroud gas generating system for the ion channel microprobe apparatus of FIG. 1.

Referring to FIG. 3, the shroud gas generating system 70 produces a shroud gas 34 which can have varying compositions. For example, the shroud gas generating system 70 can produce shroud gas 34 having rubidium atoms in argon gas by passing ultra-dry argon through a reservoir containing rubidium. The shroud gas generating system 70 consists of a pressurized tank of gas 72 such as argon, pressure regulator 74, ultra-dry water scrubber 76, and rubidium vapor source 78. Ultra-dry argon having a water concentration much less than $10^{-11}$ molecules per cm$^3$ is essential because water reacts with rubidium (Rb) to produce RbOH+ H, thereby destroying the Rb content of the shroud gas. The ultra-dry water scrubber 76 includes a chamber, such as an alkali metal heat pipe oven, containing an inexpensive alkali metal (Na or K) in the liquid or vapor phase. Other components of the shroud gas generating system 70 include valves 80, 82 and 84, pressure gauge/flow meter 86 and vacuum pump 88. The shroud gas 90 is invisible and at STP may be emitted into the atmosphere 92 causing the displacement of air. Typically, the atom density of the rubidium or other metal is fixed at approximately $10^{11}$ atoms per cm$^3$, and the temperature is approximately 25° C., although much higher temperatures can be used.

The transparent electrode preferably comprises a glass plate 22 undercoated with a semi-transparent electrically conductive film 24, such as semi-transparent metals or semiconductors. Transparent electrodes can be made in other shapes and configurations than those described here. They can be composed of various different optical substrates such as glass, fused silica, plastic, or other materials coated with semitransparent conductive films such as $SnO_2$, CdS, other semiconductors or metals such as silver, aluminum, etc. Alternatively, metal wire grids or meshes may be used.

Other variations exist for the laser systems such as an external cavity diode laser system or diode laser systems that can be frequency locked, using locking circuitry 52 that locks to a reference frequency, such as a Fabry-Perot etalon, a cavity, or through the use of atomic or molecular resonances. Laser beam optical transport and scanning can also be incorporated into the invention disclosed herein. Lasers can be frequency doubled, tripled, mixed, etc.

For the detection electronics, other variations exist such as the use of pico or subpicoammeters or box-car integrators. Variants for the laser modulation can include the use of mechanical choppers, acousto-optic or electro-optic modulators.

Finally, more than one ion channel can be formed on a single test surface. These multiple ion channels could scan the test surface together or independently.

Figure 4:
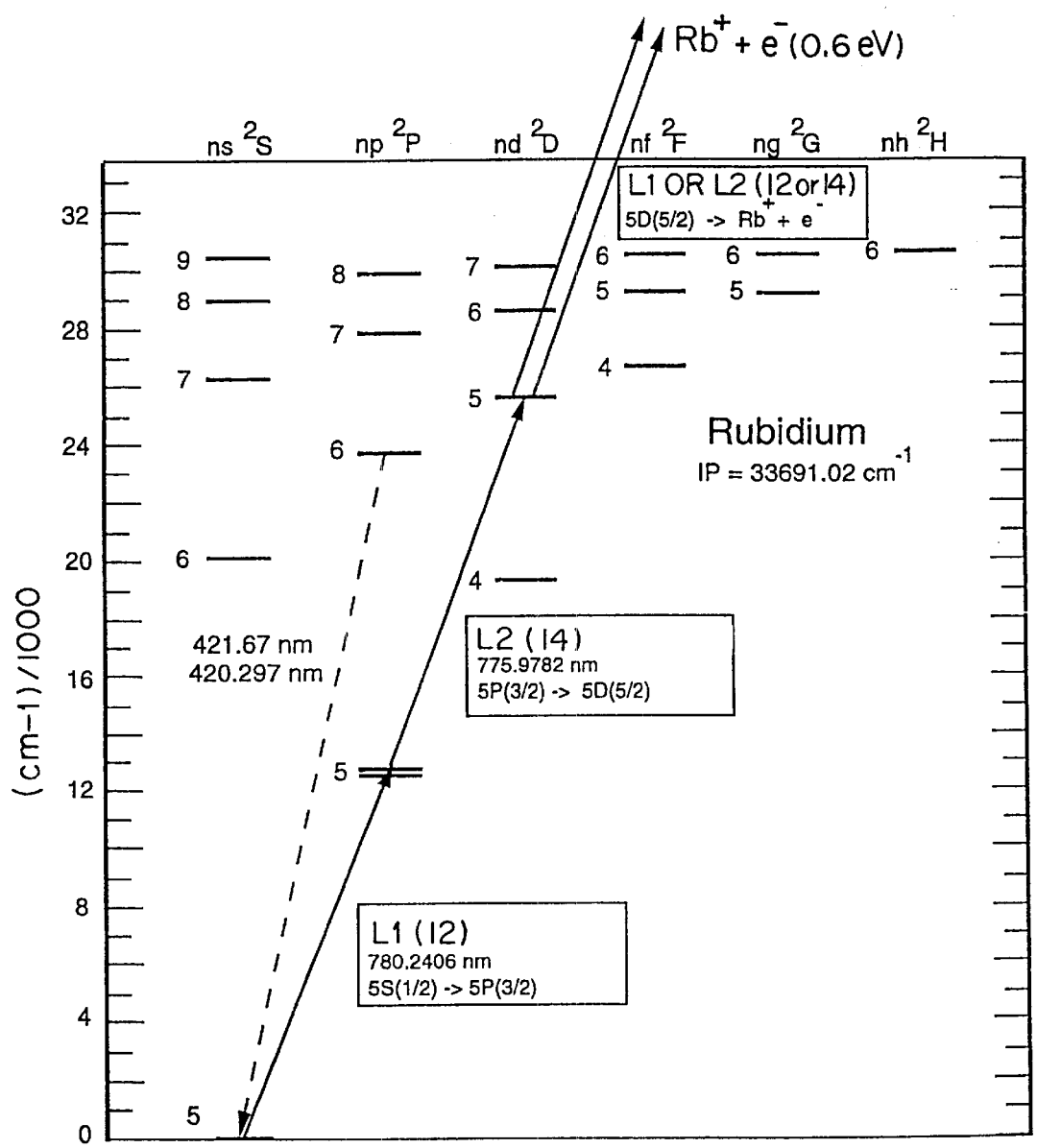
FIG. 4 is Grotrian diagram of rubidium showing the excitation scheme for the ion channel microprobe formation using two-photon resonant three-photon ionization of a shroud gas composed of rubidium atoms in argon.
Figure 5:
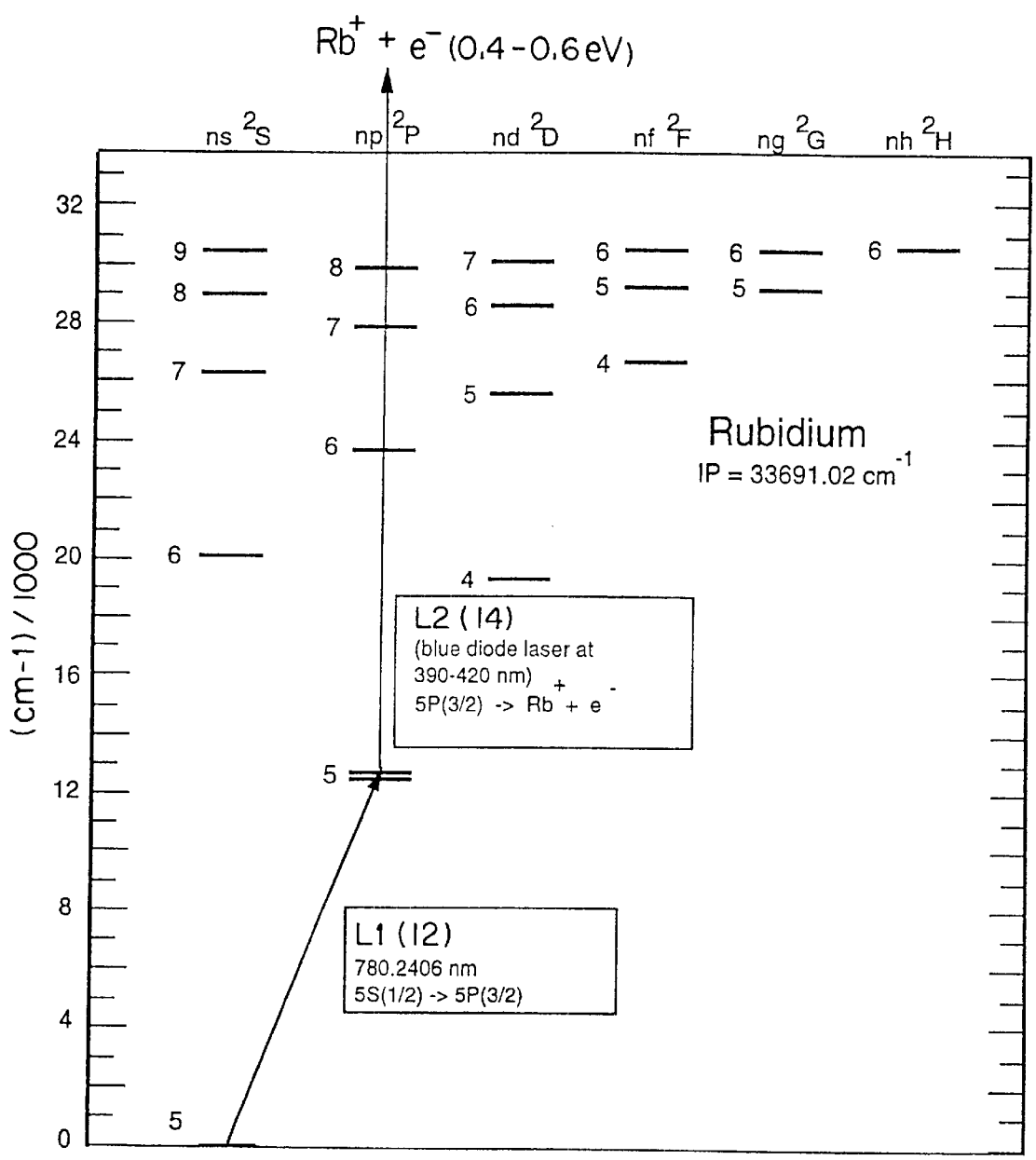
FIG. 5 is Grotrian diagram of rubidium showing the excitation scheme for the ion channel microprobe formation using one-photon resonant two-photon ionization of a shroud gas composed of rubidium atoms in argon.

FIGS. 4 and 5 are Grotrian diagrams that show additional information relating to ICM ionization mechanisms and ion channel properties. In these figures, the vertical scale represents energy and is in thousands of wavenumbers. The atomic states are represented by short horizontal lines. Atomic states that are in the same vertical column have the same electronic orbital angular momentum quantum number.

FIG. 4 is a Grotrian diagram of rubidium showing the excitation scheme for the ion channel microprobe formation using two-photon resonant three-photon ionization of a shroud gas composed of rubidium atoms in argon. For this example, the first laser 12 (L1) is a diode laser having a wavelength of 780 nm and the second laser 14 (L2) is a diode laser having a wavelength of 776 nm.

FIG. 5 is a Grotrian diagram of rubidium showing the excitation scheme for the ion channel microprobe formation using one-photon resonant two-photon ionization of a shroud gas composed of rubidium atoms in argon. For this example, the first laser 12 (L1) is a diode laser having a wavelength of 780 nm and the second laser 14 (L2) is a blue diode laser having a wavelength in the range 390–420 nm.

It is important to note that the present invention cannot work using quasiresonant photoexcitation, which would be the equivalent of removing L1 from FIGS. 4 and 5. This is because a critical atomic alkali metal density of approximately $10^{17}$ atoms per cm$^3$ is necessary before quasiresonant photoexcitation will initiate breakdown and conduction. More specifically, the present invention preferably operates at typical alkali metal atom densities of approximately $10^{11}$ atoms per cm$^3$, which is six orders of magnitude below the quasiresonant threshold density at approximately $10^{17}$ atoms per cm$^3$.

Figure 6:
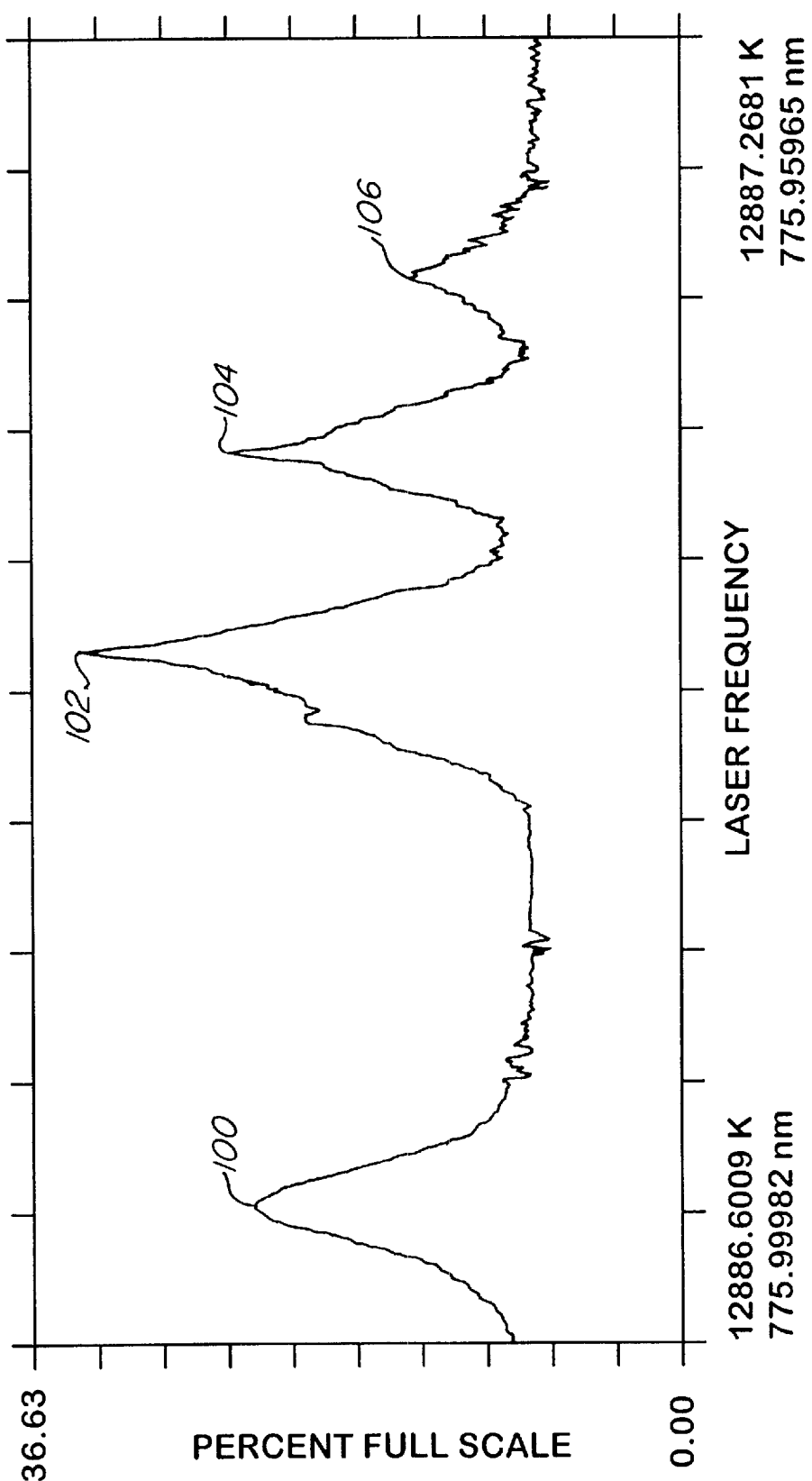
FIG. 6 is a scan of the relative intensity of laser induced fluorescence (Rb(6p-5s)) at 421.7 and 420.3 nm of rubidium atoms as a function of the wavelength of a second laser, wherein a first laser is fixed at the frequency of 12816.41 $cm^{-1}$.

FIG. 6 is a graph of the intensity of laser induced fluorescence (at 421.7 and 420.3 nm, see FIG. 4) of rubidium/argon shroud gas at a pressure of about 100 m Torr and room temperature as a function of laser frequency. In FIG. 6, a first laser L1 is fixed at a frequency of 12816.41 cm$^{-1}$ while the frequency of a second laser L2 is varied over the range shown. The four peaks 100, 102, 104, 106 show the natural hyperfine resonances of the rubidium/argon shroud gas. As would be understood by one of ordinary skill in the art, tuning the laser frequency and bandwidth to a natural resonant peak of the shroud gas, the performance of the ion channel microprobe may be optimized. It should be noted that the optimum frequency can change as the pressure of the shroud gas changes.

Figure 7A:
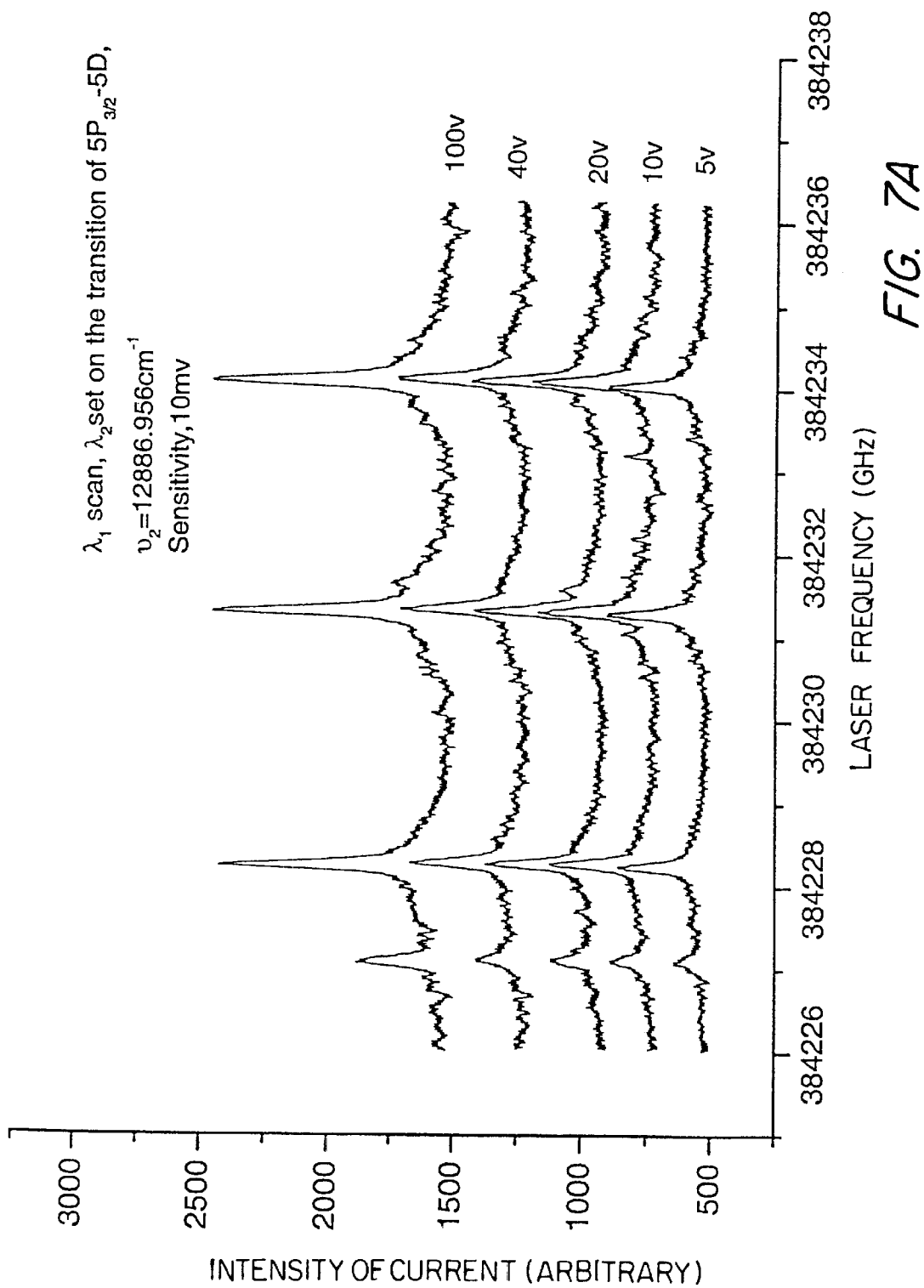
FIGS. 7a and 7b are scans of ICM current as a function of the frequency of a first laser at various applied voltages, wherein a second laser wavelength is set on the 5p(3/2)-5d (5/2) transition.
Figure 7B:
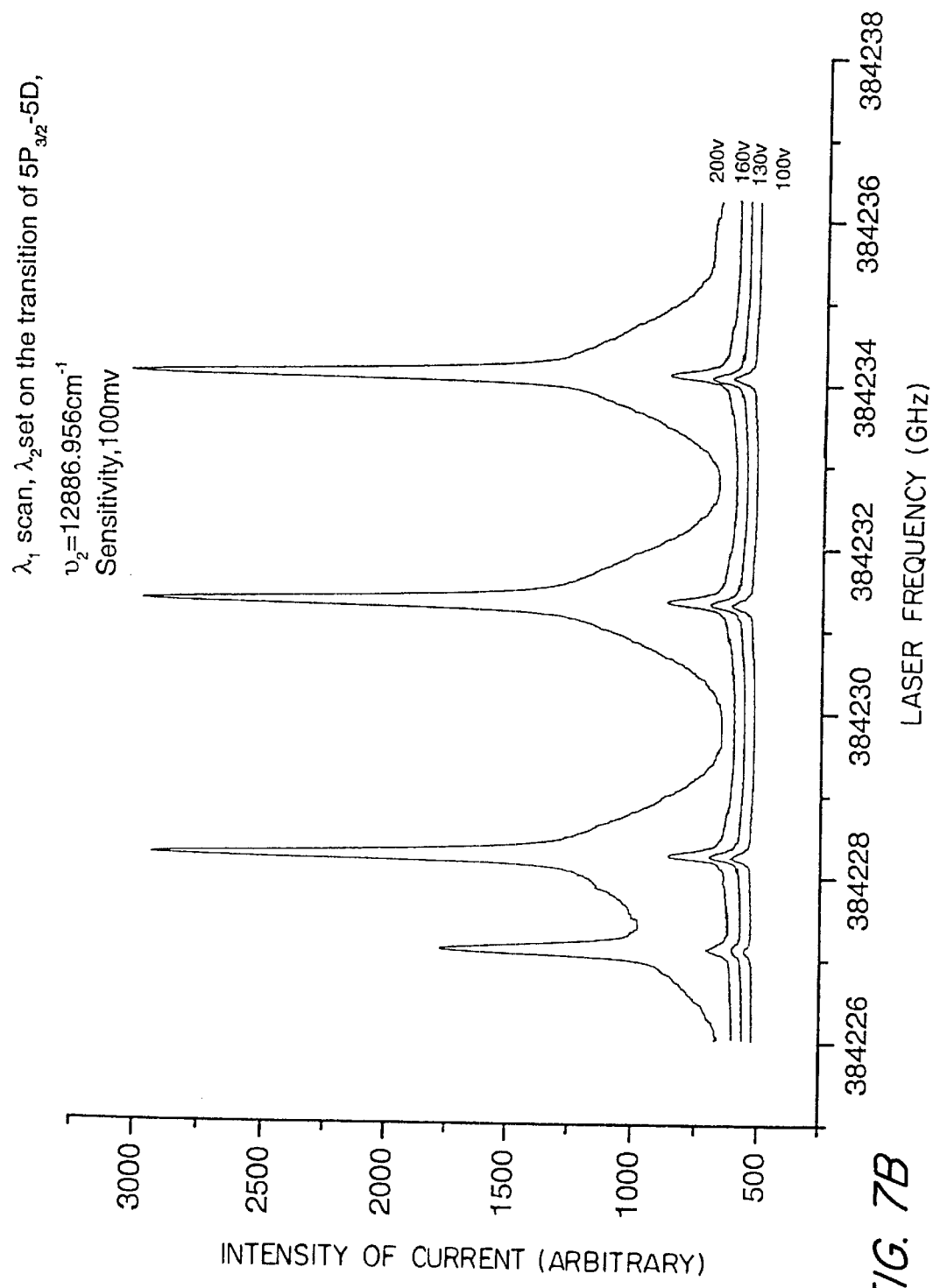

FIGS. 7a and 7b are graphs of ICM current of rubidium/argon shroud gas as a function of the frequency for various supply voltages applied across the ion channel microprobe, demonstrating the rubidium (5s) hyperfine structure. In these Figures, two laser sources are utilized, a second laser L2 fixed at the 5p(3/2)-5d (5/2) transition and a first laser L1 whose frequency is varied near a wavelength of 780 nm. FIG. 7a comparatively shows such plots for supply voltages between 5 Volts and 100 Volts, while FIG. 7b shows such plots for supply voltages between 100 Volts and 200 Volts. Together, FIGS. 7a and 7b show that the center frequency of the resonant peaks is relatively independent of the supply voltage applied across the ion channel microprobe.

Figure 8:
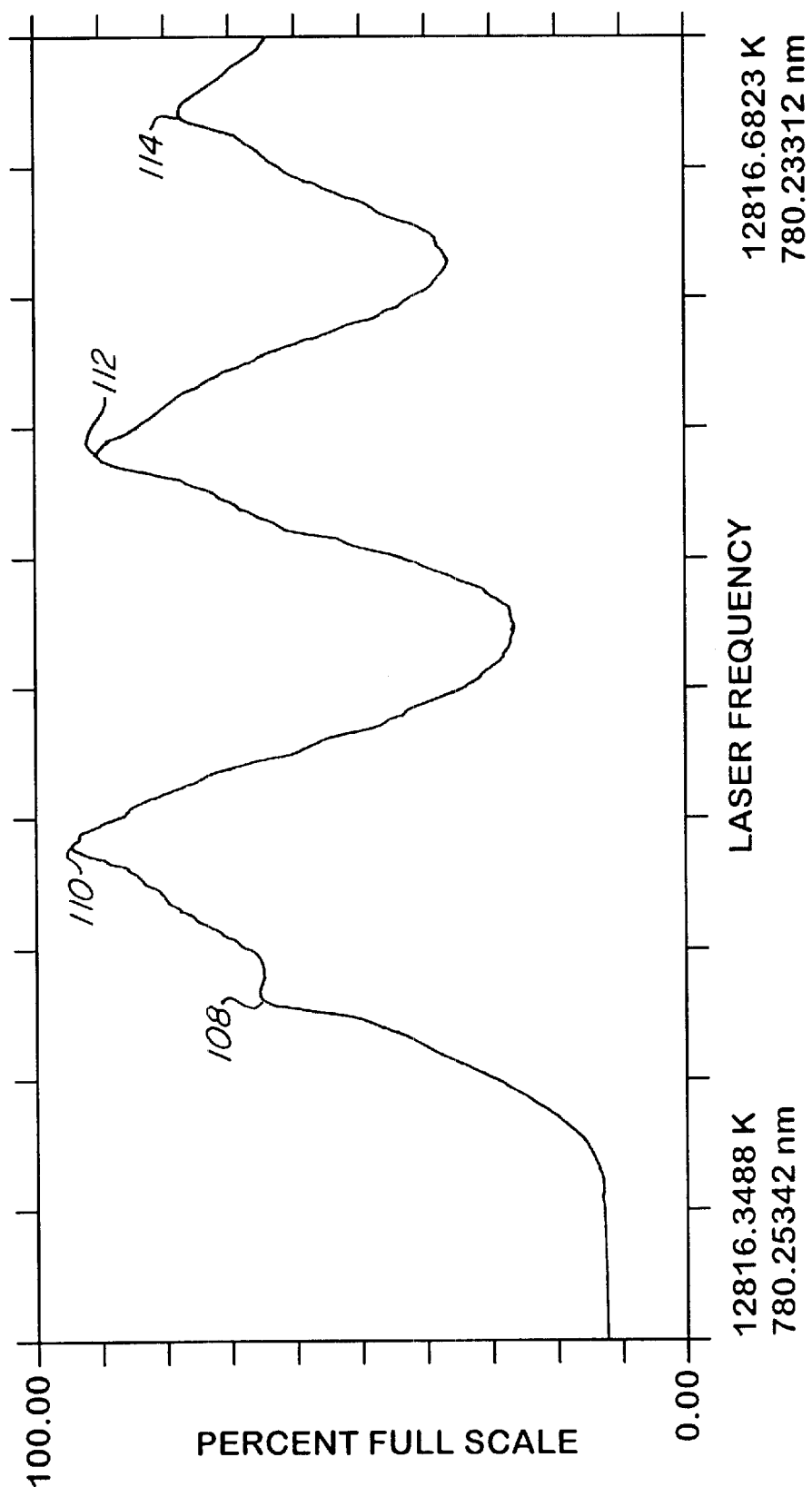
FIGS. 8 and 9 are fluorescence scans (at 421.7 and 420.3 nm) of a rubidium ground state hyperfine structure with and without a lens (f=25 cm), respectively.
Figure 9:
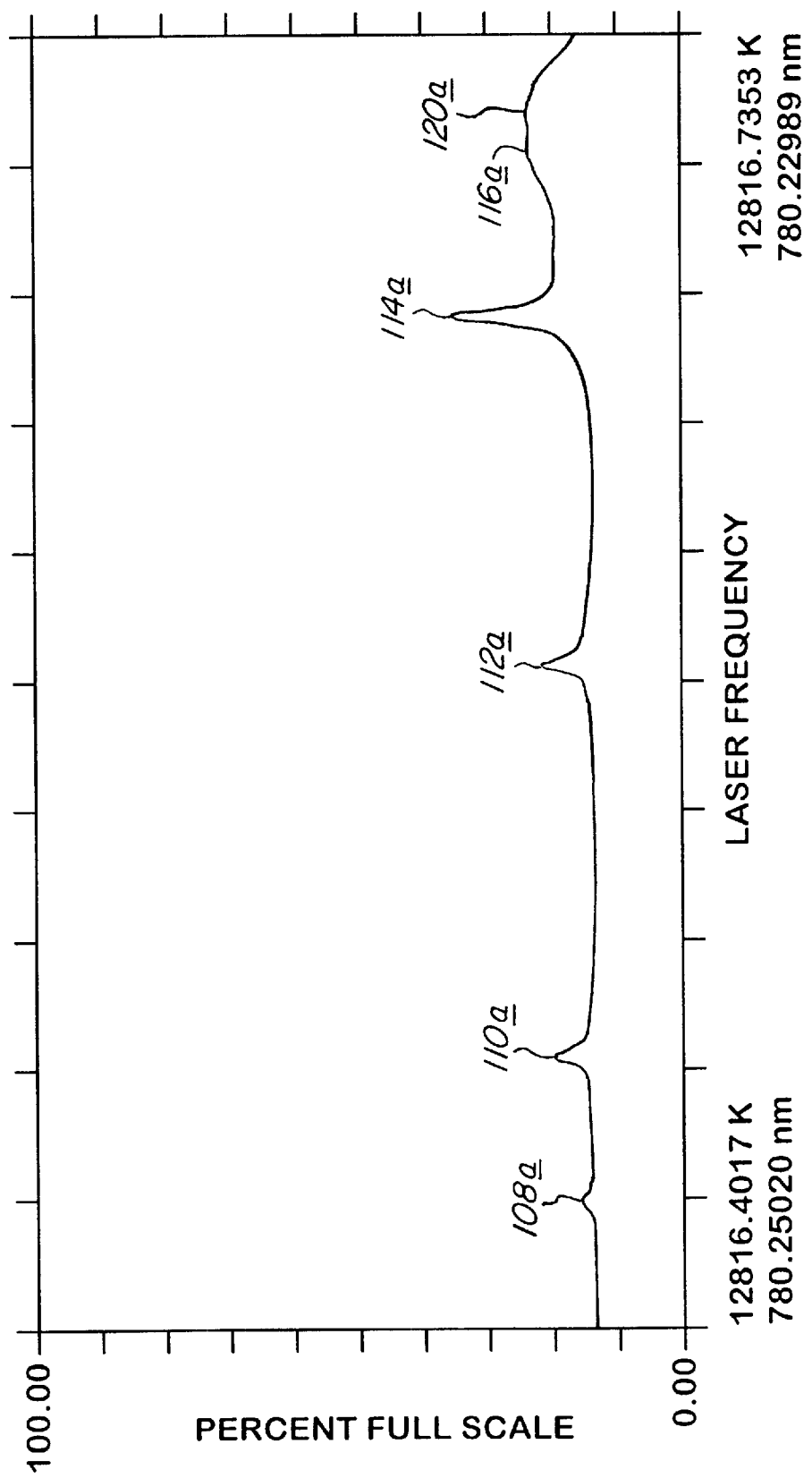

FIGS. 8 and 9 are fluorescence scans (at 421.7 and 420.3 nm) of the rubidium ground state hyperfine structure. FIG. 8 shows the resonant peaks 108, 110, 112, 114 of a fluorescence scan with a lens (f=25 cm). FIG. 9 shows the resonant peaks 108a–120a of a fluorescence scan without a lens. It is easily seen from comparing FIGS. 8 and 9 that the resonant peaks 108–114 with a lens are power broadened in comparison to the corresponding peaks 108a–114a without a lens.

Figure 10:
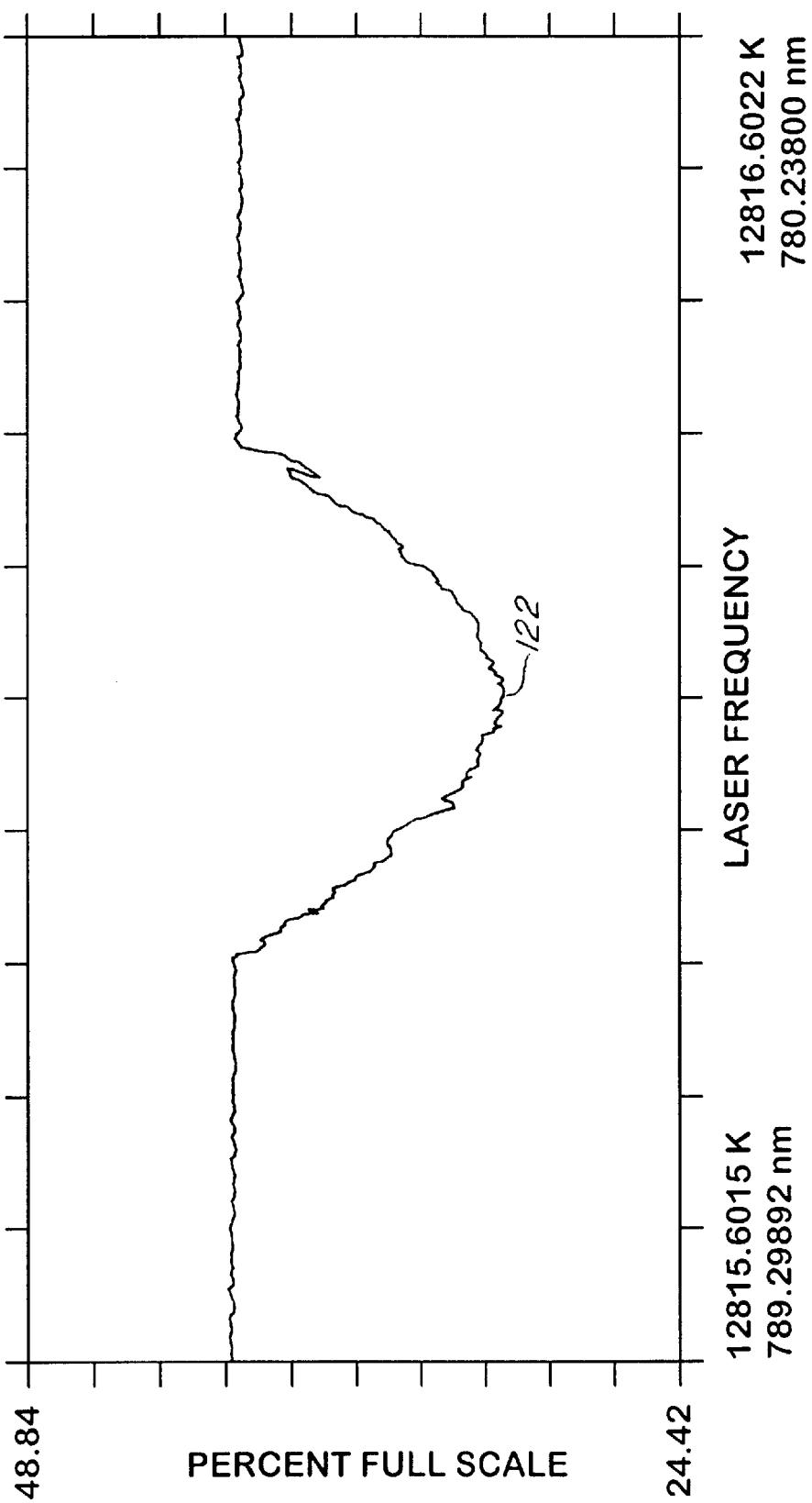
FIG. 10 is an absorption spectrum of Rb/Ar shroud gas at STP at approximately 780 nm.

FIG. 10 is an absorption spectrum of Rb/Ar shroud gas at STP near the wavelength of 780 nm. It can be seen that the absorption is greatest at point 122 having a wavelength of approximately 780.26 nm.

Figure 11:
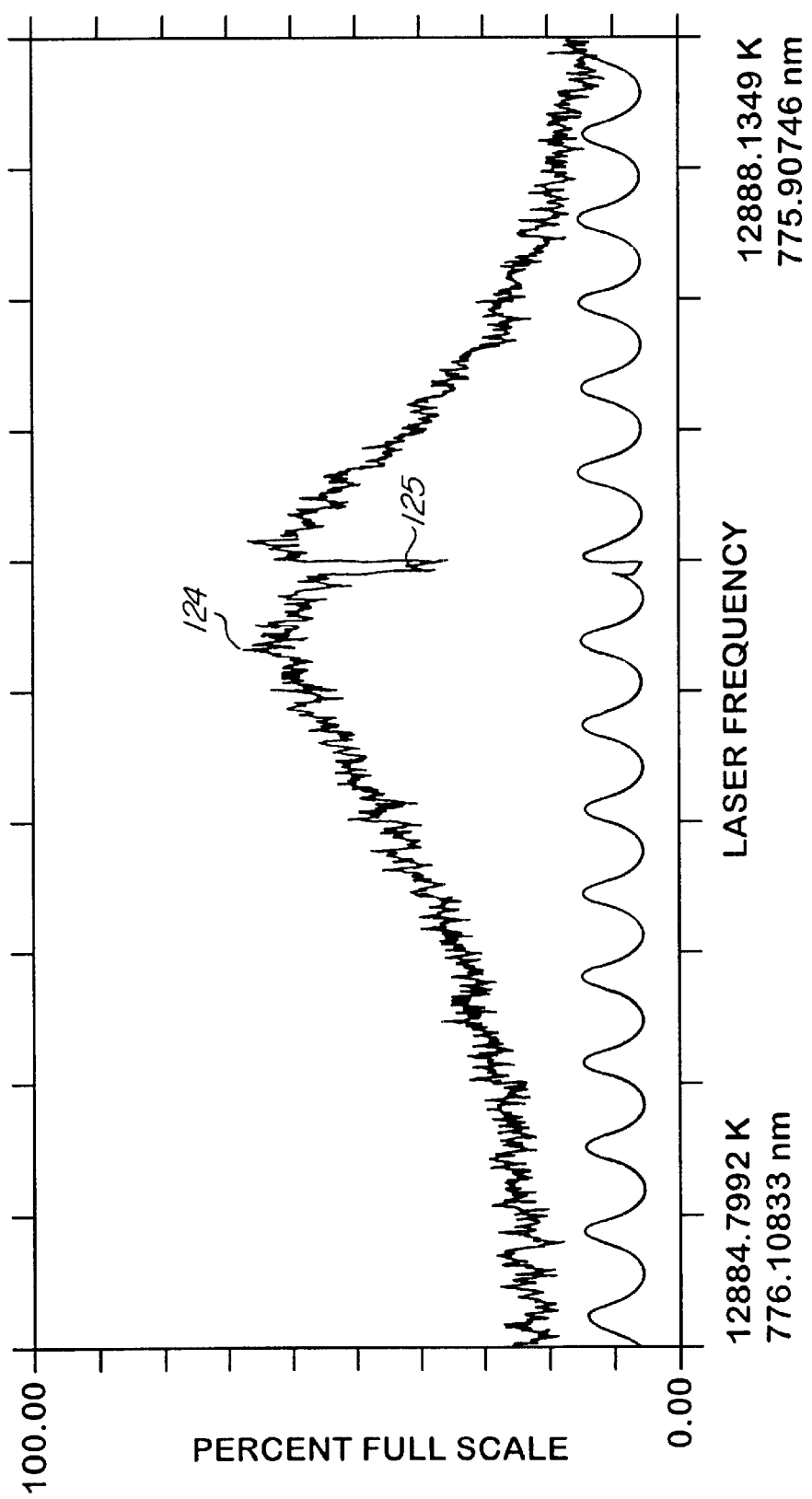
FIG. 11 is an LIF action spectrum of the Rb 5p(3/2)-5d transition at STP.

FIG. 11 is an LIF action spectrum of the Rb 5p(3/2)-5d transition at STP with a first laser L1 fixed at a frequency of 12816.100 cm$^{-1}$. The optimal laser bandwidth and frequency can be determined by tuning the second laser L2 and measuring the current across the ion channel (ICM current). In FIG. 11, the resonance peak is shown at point 124 showing the optimal frequency for the second laser (the dip at point 125 is an experimental artifact).

Figure 12:
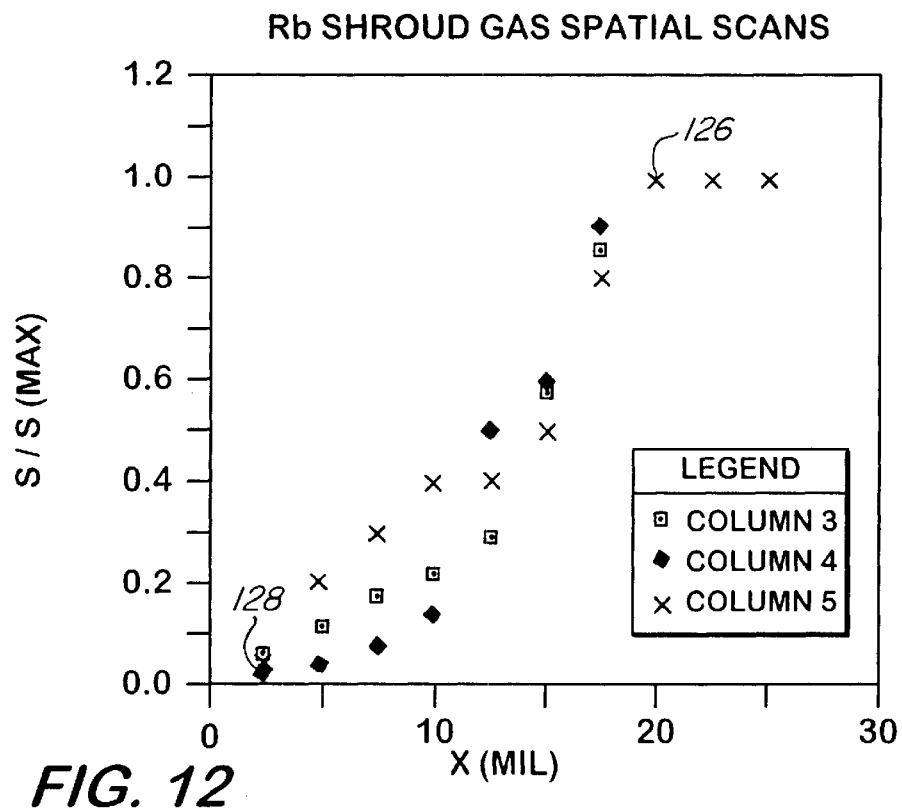
FIG. 12 shows three spatial scans of the Rb/Ar ICM to establish that conductivity is confined to the region of the laser beam.

FIG. 12 is a spatial scan of the ICM generated using a Rb/Ar shroud gas, across a metal edge to establish that conductivity of the ICM is confined to the volume filled by the laser beam. For this figure, the level of conductivity was normalized for a 20 mil diameter (0.020 inches) laser beam that was scanned across a target having a metal edge. As can be seen from FIG. 12, when the laser beam is near the edge of the target as represented by point 128, the conductivity of the ICM is near zero. In other words, the laser beam is almost missing the target and the ion channel is minimally conductive. When the laser beam is located at 20 mil (0.020 inches) along the target edge as represented by point 126, the normalized conductivity of the ICM is close to one because the entire laser beam cross sectional area ($\pi(0.008 \text{ inches})^2$) is hitting the target.

Figure 13:
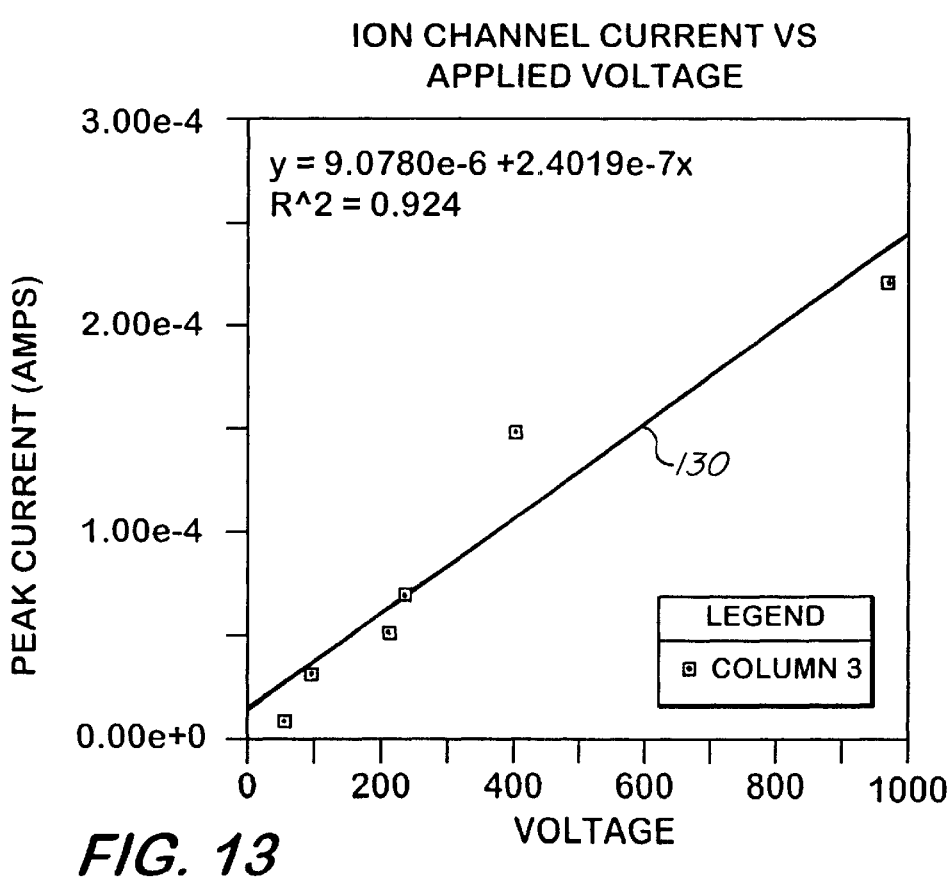
FIGS. 13, 14 and 15 are graphs of current as a function of supply voltage to determine the ICM resistance.
Figure 14:
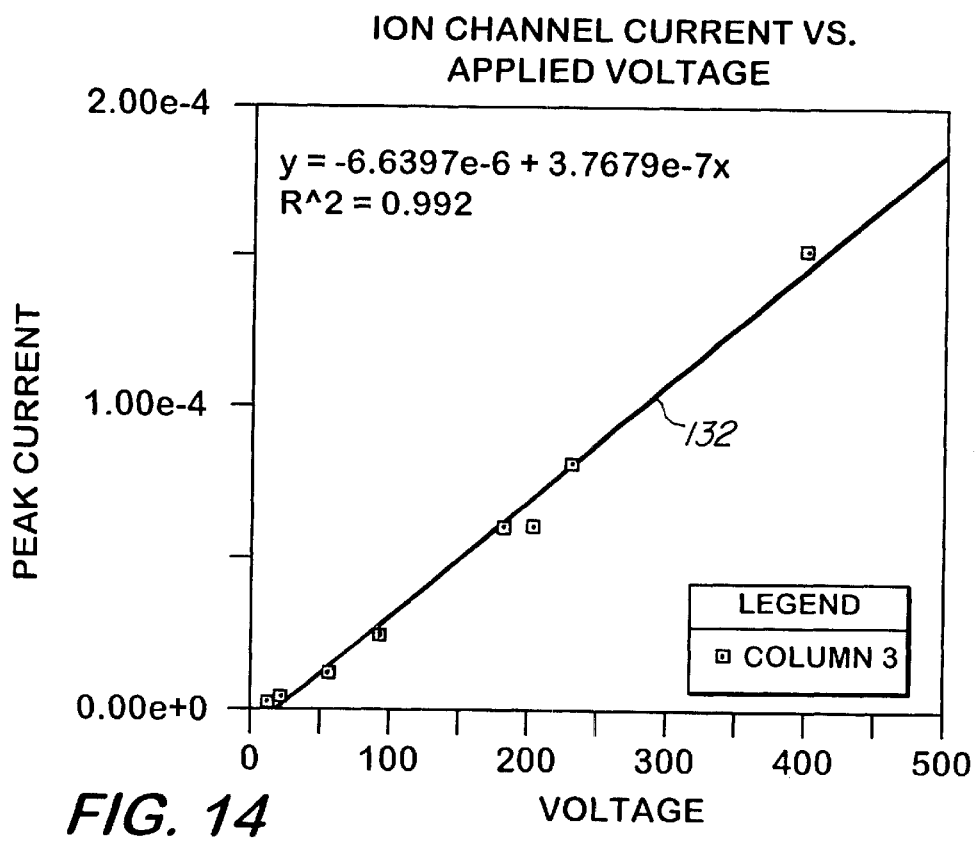
Figure 15:
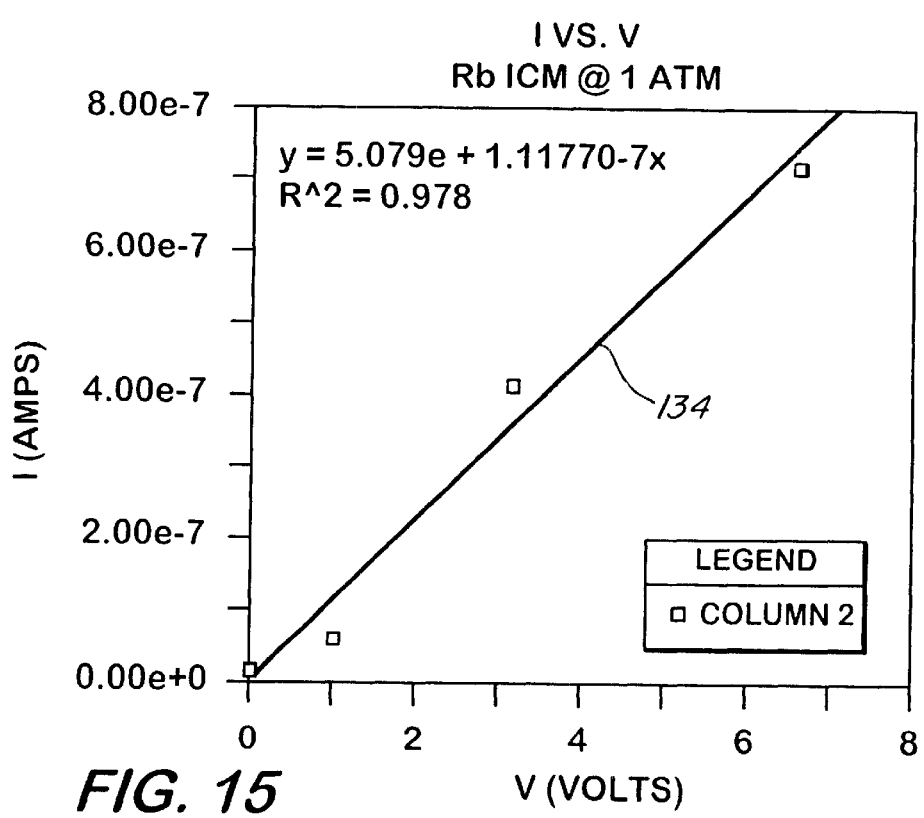

FIGS. 13, 14 and 15 are graphs of current as a function of supply voltage to determine the ICM resistance. From these figures, the ICM resistance value can be calculated as the inverse of the slope of the line 130, 132 or 134. For FIGS. 13, 14 and 15, the experimental resistances were found to be 4.2 MOhms, 2.6 MOhms and 4.5 MOhms, respectively. These measurements were taken with (Rb/Ar) shroud gases at comparable temperatures of approximately 30° C. By increasing the laser power, the resistances have been reduced to the range of approximately 100KOhms. FIGS. 13, 14 and 15 show that the ICM acts similar to a true resistor in that its resistance is independent of the supply voltage.

In operation, at least one laser for generating a resonant laser beam must be provided to produce an ion channel microprobe. Preferably, two lasers having different frequencies are used. Also, a shroud gas must be provided that consists essentially of a gas and an alkali metal, wherein the gas is either argon, helium, neon, krypton, xenon or nitrogen, and the alkali metal is either rubidium, potassium or cesium.

Next, the laser beam is propagated through the first conductive material and through the shroud gas. The first conductive material can enclose the shroud gas as shown in FIG. 1. When the laser beam travels through the shroud gas, it will produce an ion channel within the shroud gas so long as it has been prepared as described above. Next, the laser beam contacts a second conductive material, such as a test pad, preferably by terminating on the material. When this takes place, the laser will create an electrically conductive ion channel between the first electrically conductive material and the second electrically conductive material such that it creates an electrical path therebetween.

Next, an electrical potential is provided between the first and second terminals such that it creates a current over the electrical path between the first and second electrically conductive materials. Next, it is detected whether current is flowing through the conductive path. If the second conductive material is functional, current should flow through the electrical path. Next, the detected current level is read to determine whether the second electrically conductive material is functional.

It should be noted that at an argon pressure of one atmosphere, uncompensated shifts and broadening of the atomic resonances are expected to reduce photoionization yields. Alkalis perturbed by argon gas collisions are typically red shifted and broadened by approximately 10–20 MHz/Torr. At one atmosphere, it is expected that atomic resonances will be shifted and broadened by approximately 15–30 GHz. It has been estimated that the K/Kr 4s-5p transition is pressure broadened to a width of approximately 30 GHz at 1 atmosphere Kr. By measuring ICM current as a function of the frequencies of the lasers L1 and L2 at increasing pressures, it has been possible to make accurate determinations of collisional shifts and broadenings of Rb resonances. This information is important for the development of an inexpensive ion channel microprobe since it allows us to precisely specify the optimum wavelengths and bandwidths of the inexpensive diode lasers required. If "free-running" diode lasers cannot be adequately controlled, it may become necessary to utilize additional controls such as frequency locking or "external" cavities.

It should be understood that the foregoing is illustrative and not limiting and that obvious modifications may be made by those skilled in the art without departing from the spirit of the invention. Accordingly, reference should be made primarily to the accompanying claims, rather than the foregoing specification, to determine the scope of the invention.

What is claimed is:

1. A system for producing an ion channel, comprising:
   a first electrically conductive material;
   a second electrically conductive material being spaced from said first electrically conductive material;
   a shroud gas coupled with said first and second electrically conductive materials, which shroud gas includes a member selected from the group consisting of alkali metals of Group 1 of the Periodic Table and alkaline earth metals of Group 2 of the Periodic Table in combination with a member selected from the group consisting of noble gases of Group 8 of the Periodic Table and nitrogen; and
   at least one laser being operatively configured to generate a resonant laser beam such that said laser beam propagates through said first conductive material, propagates through said shroud gas to produce an ion channel within said shroud gas, contacts said second conductive material, to create an electrically conductive ion channel between said first electrically conductive material and said second electrically conductive material to define first and second terminals, respectively, of an electrical path.

2. The system of claim 1, further comprising:
   an electrical source coupled between said first and second terminals for producing a signal on said electrical path; and
   a signal detector for detecting the signal produced on said electrical path.

3. The system of claim 2, wherein the electrical source is a current source and the signal detector is an ammeter.

4. The system of claim 3, further comprising:
   a lock-in amplifier coupled to said ammeter;
   a computer for storing a representation of said signal; and
   a monitor being coupled to said computer for displaying the representation of said signal.

5. The system of claim 1, wherein two lasers are provided for generating first and second laser beams, respectively, wherein said first and second laser beams are both resonant with said metal.

6. The system of claim 5, wherein said first laser beam has a different frequency than said second laser beam.

7. The system of claim 6, further comprising:
   a beam combiner located within a first path of said first laser beam and a second path of said second laser beam, said beam combiner operatively configured to combine said first and second laser beams to produce a co-propagating laser beam, wherein said co-propagating laser beam propagates through said shroud gas producing an ion channel within said shroud gas.

8. The system of claim 7, further comprising an optical element located within a third path of said co-propagating laser beam for focusing said co-propagating beam through said shroud gas.

9. The system of claim 1, wherein the shroud gas has a temperature between about 40° C. to about 50° C. and a pressure between about 0.5 atm to about 1.5 atm.

10. The system of claim 1, wherein an excitation of the ion channel is one-photon resonant, two photon ionization.

11. The system of claim 1, wherein an excitation of the ion channel is two-photon resonant, three photon ionization.

12. The system of claim 1, wherein said first electrically conductive material is a transparent semiconductor electrode.

13. The system of claim 1, wherein said resonant laser beam results from two combined frequencies.

14. The system of claim 1, wherein the shroud gas has a water concentration less than $10^{11}$ molecules per $cm^3$.

15. A system for producing an ion channel, comprising:
   an electrically conductive material;
   an electrically conductive test point spaced from said electrically conductive material;
   a shroud gas electrically coupled with said electrically conductive material and said electrically conductive test point, which shroud gas includes an alkali metal selected from the group consisting of rubidium, potassium and cesium in combination with a gas selected from the group consisting of argon, helium, neon, krypton, xenon and nitrogen, said gas having a temperature of less than about 100° C. and a pressure greater than about 0.5 atm; and
   at least one continuous low intensity wave laser being operatively configured to generate a resonant laser beam such that said laser beam propagates through said electrically conductive material, propagates through said shroud gas to produce an ion channel within said shroud gas, contacts said electrically conductive test point, and creates by resonant excitation an electrically conductive metal ion channel between said electrically conductive material and said electrically conductive test point to define an electrically conductive path.

16. The system of claim 15, further comprising:
   an electrical source coupled between said electrically conductive material and said electrically conductive test point for producing a signal on said electrically conductive path; and
   a signal detector for detecting the signal produced on said electrically conductive path.

17. The system of claim 16, wherein the electrical source is a current source and the signal detector is an ammeter.

18. The system of claim 17, further comprising:
   a lock-in amplifier coupled to said ammeter;
   a computer for storing a representation of said signal; and
   a monitor being coupled to said computer for displaying the representation of said signal.

19. The system of claim 15 wherein two lasers are provided for generating first and second laser beams, respectively, wherein said first and second laser beams are both resonant with said metal.

20. The system of claim 19, wherein said first laser beam has a different frequency than said second laser beam.

21. The system of claim 20, further comprising:
   a beam combiner located within a first path of said first laser beam and a second path of said second laser beam, said beam combiner operatively configured to combine said first and second laser beams to produce a co-propagating laser beam, said copropagating laser beam propagating through said shroud gas and producing an ion channel within said shroud gas.

22. The system of claim 21, further comprising an optical element located within a third path of said co-propagating laser beam for focusing said co-propagating beam through said shroud gas.

23. The system of claim 19, wherein an excitation of the ion channel is one-photon resonant, two photon ionization.

24. The system of claim 19, wherein an excitation of the ion channel is two-photon resonant, three photon ionization.

25. The system of claim 19, wherein said electrically conductive film is a transparent semiconductor electrode.

26. The system of claim 19, wherein the shroud gas has a water concentration less than $10^{11}$ molecules per $cm^3$.

27. The system of claim 15, wherein the shroud gas has a temperature between about 40° C. to about 50° C. and a pressure between about 0.5 atm to about 1.5 atm.

28. The system of claim 15, wherein an excitation of the ion channel is one-photon resonant, two photon ionization.

29. The system of claim 15, wherein an excitation of the ion channel is two-photon resonant, three photon ionization.

30. The system of claim 15, wherein said electrically conductive material is a transparent semiconductor electrode.

31. The system of claim 15, wherein said resonant laser beam results from two combined frequencies.

32. The system of claim 15, wherein the shroud gas has a water concentration less than $10^{11}$ molecules per $cm^3$.

33. A system for producing an ion channel, comprising:
   a first electrically conductive material;
   a second electrically conductive material being spaced from said first electrically conductive material;
   a shroud gas coupled with said first and second electrically conductive materials, which shroud gas includes a member selected from the group consisting of alkali metals of Group 1 of the Periodic Table and alkaline earth metals of Group 2 of the Periodic Table in combination with a member selected from the group consisting of noble gases of Group 8 of the Periodic Table and nitrogen; and
   at least one laser being single photon resonant with said metal group member's electronic state and being operatively configured to generate a resonant laser beam such that said laser beam propagates through said first conductive material, propagates through said shroud gas to produce an ion channel within said shroud gas, contacts said second conductive material, to create an electrically conductive ion channel between said first electrically conductive material and said second electrically conductive material to define first and second terminals, respectively, of an electrical path.

34. A system for producing a conductive ion channel for testing an electrically conductive test point, comprising:
   an electrically conductive film;
   an electrically conductive test point being spaced from said electrically conductive film;
   a shroud gas electrically coupled with said electrically conductive film and said electrically conductive test point, which shroud gas includes an alkali metal selected from the group consisting of rubidium, potassium, lithium, sodium and cesium in combination with a gas selected from the group consisting of argon, helium, neon, krypton, xenon and nitrogen, said gas having a temperature of between about 40° C. to about 50° C. and a pressure between about 0.5 atm and about 1.5 atm;
   first and second continuous wave lasers operatively configured to generate first and second resonant laser beams, respectively, each resonant laser beam having a different frequency than the other;
   a beam combiner located within a first path of said first laser beam and a second path of said second laser beam, said beam combiner operatively configured to combine said first and second resonant laser beams to produce a co-propagating resonant laser beam;
   an optical element located within a third path of said co-propagating laser beam for focusing said co-propagating laser beam, said optical element configured such that said co-propagating laser beam propagates through said electrically conductive film, propagates through said shroud gas to produce an ion channel within said shroud gas, contacts said electrically conductive test point, and creates by resonant excitation of said metal group member an electrically conductive ion channel between said electrically conductive film and said electrically conductive test point to define first and second terminals, respectively, of an electrically conductive path;
   an electrical source coupled between said first and second terminals for producing a signal on said electrically conductive path; and
   a signal detector for detecting the signal produced on said electrically conductive path.

35. The system of claim 34, wherein the electrical source is a current source and the signal detector is an ammeter.

36. The system of claim 35, further comprising:
   a lock-in amplifier coupled to said ammeter;
   a computer for storing a representation of said signal; and
   a monitor being coupled to said computer for displaying the representation of said signal.

37. A method for producing a conductive ion channel between first and second electrically conductive materials, comprising the steps of:
   providing a shroud gas coupled with said first and second electrically conductive materials, said shroud gas including an alkali metal selected from the group consisting of rubidium, potassium, sodium, lithium and cesium in combination with a gas selected from the group consisting of argon, helium, neon, krypton, xenon and nitrogen;
   providing at least one laser that is resonant with the electronic state of said alkali metal for generating a resonant laser beam;
   propagating the laser beam through the first conductive material and through the shroud gas to produce an ion channel within the shroud gas;
   contacting the laser beam with the second conductive material; and
   creating by resonant excitation an electrically conductive ion channel between the first electrically conductive material and the second electrically conductive material to define first and second terminals, respectively, of an electrical path.

38. The method for producing a conductive ion channel of claim 37, further comprising the steps of:
   providing an electrical potential between said first and second terminals; and detecting the electrical potential provided between said first and second terminals.

39. The method of claim 38, wherein the first electrically conductive material is coupled to a test pad on a printed circuit board, further comprising the steps of:

reading the detected electrical potential; and determining whether the test pad is functional from the reading of the detected electrical potential.

40. A shroud gas which can be ionized which comprises an alkali metal selected from the group consisting of rubidium, potassium, lithium, sodium and cesium in combination with a gas selected from the group consisting of argon, helium, neon, krypton, xenon and nitrogen, said gas having a temperature of less than about 100° C. and a pressure greater than about 0.5 atm; wherein said alkali metal group member has an atomic density of approximately $10^{11}$ atoms per $cm^3$ in said shroud gas.

41. A shroud gas according to claim 40 wherein said alkali metal is rubidium.

42. A shroud gas according to claim 40 wherein said gas group member is argon.

43. A shroud gas according to claim 40 wherein said alkali metal is rubidium and said gas group member is argon.

44. A shroud gas according to claim 40 wherein said gas has a temperature of between about 40° C. to about 50° C.

* * * * *